United States Patent [19]

Suh et al.

[11] Patent Number: 5,349,560
[45] Date of Patent: Sep. 20, 1994

[54] SEMICONDUCTOR MEMORY DEVICE WITH IMPROVED BIT LINE PRECHARGED CIRCUITS

[75] Inventors: Young-Ho Suh, Suwon; Suk-Bin Kim, Seoul, both of Rep. of Korea

[73] Assignee: Samsung Electronics Co., Ltd., Suwon, Rep. of Korea

[21] Appl. No.: 39,741

[22] Filed: Mar. 30, 1993

[30] Foreign Application Priority Data

Mar. 30, 1992 [KR] Rep. of Korea ............... 1992-5283

[51] Int. Cl.$^5$ ............................................. G11C 7/00
[52] U.S. Cl. ................................. 365/203; 365/190
[58] Field of Search ............... 365/203, 230.03, 194, 365/190, 202

[56] References Cited

U.S. PATENT DOCUMENTS

| | | | |
|---|---|---|---|
| 4,656,608 | 4/1987 | Aoyama | 365/190 |
| 4,802,129 | 1/1989 | Hoekstra et al. | 365/203 |
| 4,888,737 | 12/1989 | Sato | 365/203 |

*Primary Examiner*—Joseph A. Popek
*Attorney, Agent, or Firm*—Cushman, Darby & Cushman

[57] ABSTRACT

A semiconductor memory device includes bit line pair precharge circuits for precharging bit lines in a memory cell array. The semiconductor memory device includes a number of memory cells each sharing a pair of bit lines, each bit line pair together with corresponding memory cells constituting the memory cell array. The memory device further includes a first bit line precharge circuit coupled to a first position along each bit line pair for precharging the respective bit lines under the control of a block selection signal and a write enable signal. A second bit line precharge circuit is connected at a second position along the bit line pair for precharging the respective bit line pair under the control of the write enable signal. A positional distance between the first position and the second position being such as to optimally reduce a bit line precharge time and a write recovery time associated with each bit line pair in the memory cell array.

4 Claims, 3 Drawing Sheets

SEMICONDUCTOR MEMORY DEVICE WITH IMPROVED BIT LINE PRECHARGED CIRCUITS

BACKGROUND OF THE INVENTION

1. Field of the Invention

The present invention relates to a semiconductor memory device, and more particularly to a circuit for precharging bit lines.

2. Description of the Related Art.

In highly integrated semiconductor memory devices, integrated circuits must necessarily be capable of high speed operation. However, memory cell sensing steps substantially reduce the highest speed operation of an integrated circuit.

In order to improve the overall speed of the bit line sensing steps during memory operations, a bit line precharge circuit is conventionally used to maintain a constant voltage level on bit lines at least during a stand-by mode of operation.

An external supply voltage VCC or VCC-$\alpha$ (where $\alpha$ is an arbitrary constant) is generally selected as the given constant voltage level determined in accordance with a particular memory's design characteristics so as to maximize the speed of a read operation (where each bit line in an associated pair of bit lines is complementarily biased in active read mode).

A bit line precharge circuit serves to precharge a bit line pair to the given constant voltage level. Such precharge voltage signals however adversely contribute in the creation of parasitic capacitances along the bit line circuit paths due to the general complexity thereof.

Researchers continue to seek ways to improve the current driving capacity of a bit line precharge circuit so as to provide more accurate memory cell readings by providing voltage levels along bit lines (i.e., supply voltage VCC or ground voltage VSS) which substantially correspond to bit line voltages after a write operation.

A conventional bit line precharge circuit 10 and interconnection thereof is illustrated in FIG. 1. A bit line precharge circuit is shown connected to one end of a bit line pair. The bit line precharge circuit 10 includes a first bit line set of precharge transistors P1 and P2 normally turned on and a second set of bit line precharge transistors P3 and P4 controlled by bit line precharge signal $\Phi$PRE. This signal is generally derived from a word line enable buffer. Alternatively, bit line precharge signal $\Phi$PRE may also be derived from a combination of an output of a word line enable buffer with the output from an address transition detector, the operation of which components is well understood in the art of semiconductor memory devices.

Signals of bit lines BL1 and BL1 are transferred through transfer transistors N1, P5, N2 and P6 to data lines DL1 and DL1 by column decoding signals Y1 and Y1 when memory cells M1, . . . , M1 are selected.

Supply voltage VCC is continuously provided to bit lines BL1 and BL1 regardless of the mode of operation as the first set of bit line precharge transistors P1 and P2 are normally turned on. This is necessary as it improves the switch to a memory cell read operation immediately after a write operation.

The second set of bit line precharge transistors P3 and P4 are enabled (turned on) in read mode to prevent overdriving already active precharge transistors P1 and P2. As a result, the speed of a read operation can be significantly improved as bit lines BL1 and BL1 can be precharged much faster up to supply voltage level Vcc following a write operation.

Conversely, precharge transistors P3 and P4 can be disabled (turned off) during a write mode/operation as sufficiently less current drive is necessary and adequately provided by active precharge transistors P1 and P2.

Bit line precharge circuit 10 is shown arranged at one end of the present chip configuration for a more convenient chip layout.

FIG. 2 shows a memory cell array layout of a chip including the precharge circuit interconnection in FIG. 1. As illustrated therein, first and second bit line precharge circuits 110 and 120 are arranged on the same side of a memory cell array 100.

Each of the second set of bit line precharge transistors P3 and P4 in the conventional bit line precharge circuit 10 of FIG. 1 is increased in size to enhance current driving capacity. In so doing, however, the load on line 11 which transmits bit line precharge signal $\Phi$PRE is necessarily increased. As a result, read mode is delayed for a sufficient time until all the second set of bit line precharge transistors P3 and P4 are enabled immediately following a write operation.

This bit line precharge delay which results from the switch from an appropriate bit line voltage (i.e., supply voltage level Vcc or ground voltage level Vss) during a write operation to a constant voltage precharge level in preparation for a read operation, sufficiently degrades a memory device's maximum speed of operation.

In order to overcome the load problem discussed above, precharge circuit configurations have been proposed in which the size of a first set of bit line precharge transistors P1 and P2 is increased while the size of a second set of bit line precharge transistors P3 and P4 is decreased.

However, when such a configuration is implemented in a memory array layout as in FIG. 2, a bit line precharge time delay difference $\tau$ (where $\tau = R \cdot C$, and R and C denote bit line parasitic resistance and bit line parasitic capacitance, respectively) occurs during a read operation—immediately following a write operation—between memory cells M1 and Mi respectively arranged nearest to and farthest from bit line precharge circuit 10.

Furthermore, when all first and second bit line precharge transistors P1, P2, P3 and P4 are enabled for a read operation, a bit line current difference per unit time is present between memory cells M1 and Mi which serves to degrade a memory cell current sensing operation.

SUMMARY OF THE INVENTION

It is an object of the present invention to provide a bit line precharge circuit wherein a bit line precharge time delay difference between first and second memory cells sharing the same bit line and separated farthest from each other in a memory cell array is minimized during a write recovery operation.

It is another object of the present invention to provide a bit line precharge circuit wherein a bit line current difference between first and second memory cells sharing the same bit line and separated farthest from each other in a memory cell array is minimized during a read operation.

In accordance with one aspect of the present invention, a semiconductor memory device includes bit line pair precharge circuits for precharging bit lines in a memory cell array. The semiconductor memory device includes a number of memory cells each sharing a pair of bit lines, each bit line pair together with corresponding memory cells constituting the memory cell array.

The memory device further includes a first bit line precharge circuit coupled to a first position along each bit line pair for precharging the respective bit lines under the control of a block selection signal and a write enable signal.

A second bit line precharge circuit is connected at a second position along the bit line pair for precharging the respective bit line pair under the control of the write enable signal. A positional distance between the first position and the second position is such as to optimally reduce a bit line precharge time and a write recovery time associated with each bit line pair in the memory cell array.

BRIEF DESCRIPTION OF THE ATTACHED DRAWINGS

The present invention will now be described more specifically with reference to the drawings attached only by way of example.

DETAILED DESCRIPTION OF THE PREFERRED EMBODIMENTS

Figure 3:
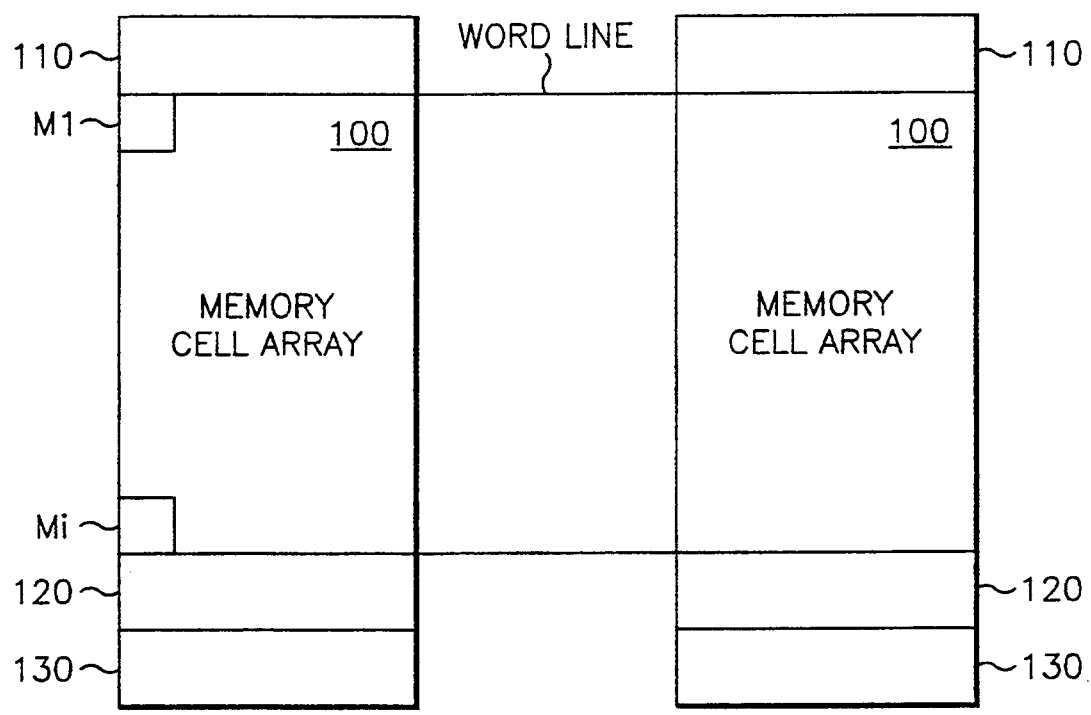
FIG. 3 shows a memory cell array layout and bit line precharge circuits associated therewith for a semiconductor memory device according to the present invention.

FIG. 3 illustrates a memory cell array 100 having a number of memory cells connected to specific word lines and bit lines in matrix form. Memory cell array 100 also includes a plurality of bit line precharge circuits positioned at a predetermined distance from each other.

First bit line precharge circuit 110 and second bit line precharge circuit 120 are shown in the block construction of FIG. 3 respectively arranged on different ends about memory cell array 100.

It is also more desirable to arrange the first bit line precharge circuit 110 and the second bit line precharge circuit 120 about opposite ends rather than about some intermediate position of a memory cell array 100.

The present arrangement is found to reduce the bit line precharge time problem more prevalent in conventional semiconductor memory array layouts including precharge circuits. The bit line precharge time in connection with the construction of the present invention is found to be reduced even when bit line length is considerably increased as well as when a greater bit line load is present.

Figure 4:
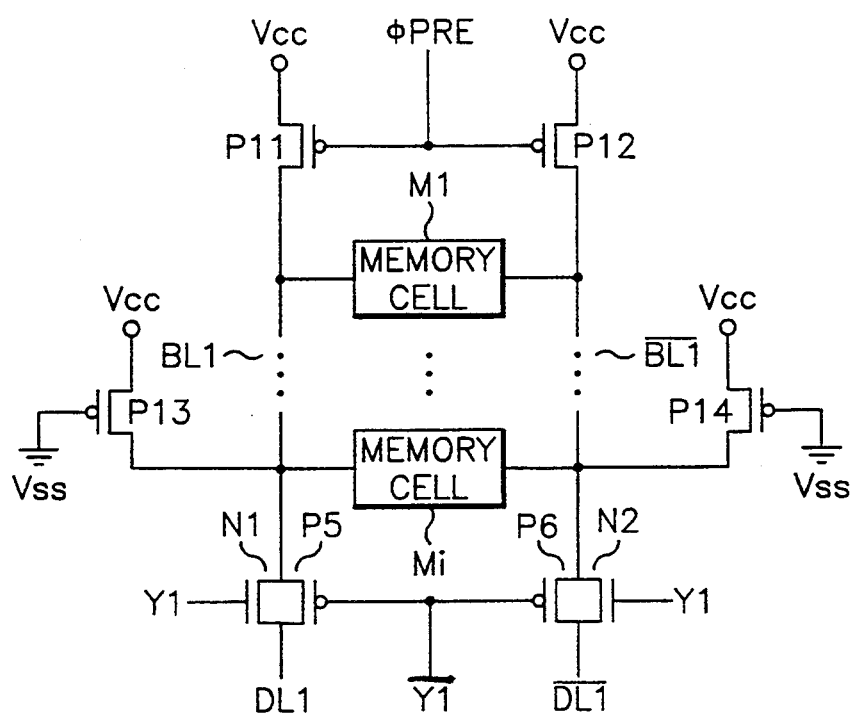
FIG. 4 shows a first embodiment of a portion of the memory device in FIG. 3.

One embodiment of the precharge circuit interconnection in accordance with the block construction of FIG. 3 is shown in FIG. 4. Bit line precharge transistors P11, P12, P13 and P14 are respectively shown arranged on different ends of a bit line pair.

More specifically, first set of bit line precharge transistors P11 and P12, enabled (turned on) under the control of a bit line precharge signal ΦPRE, are arranged on one end of bit line pair BL1 and BL1. Second set of bit line precharge transistors P13 and P14 are normally turned on and are disposed at a second end of bit line pair BL1 and BL1 closest to a column turn-on transistor associated therewith.

Figure 1:
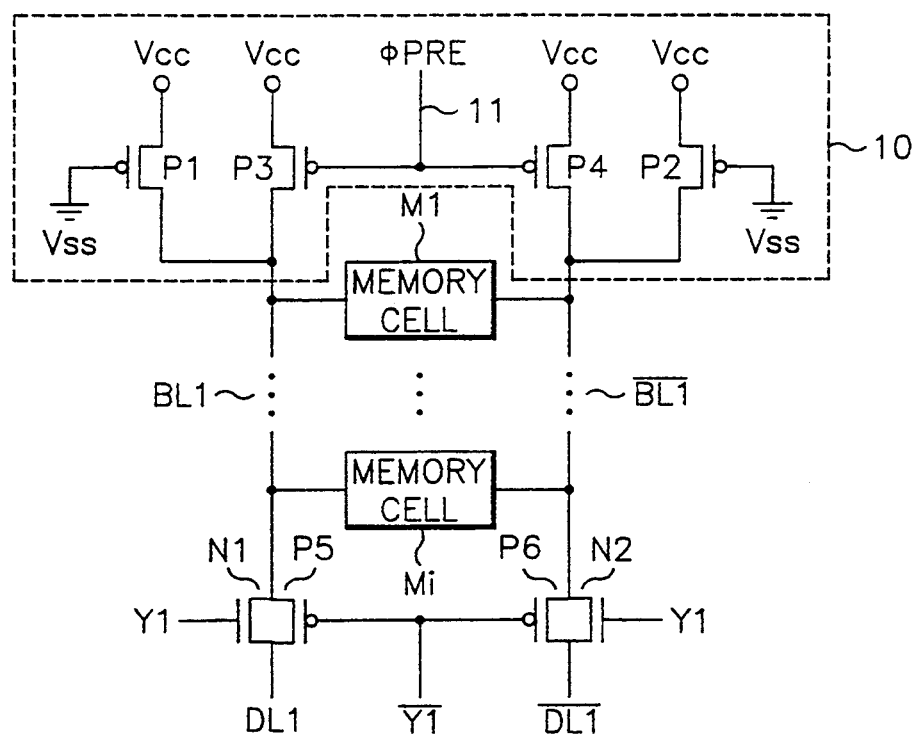
FIG. 1 shows a conventional bit line precharge circuit in a semiconductor memory device.
Figure 2:
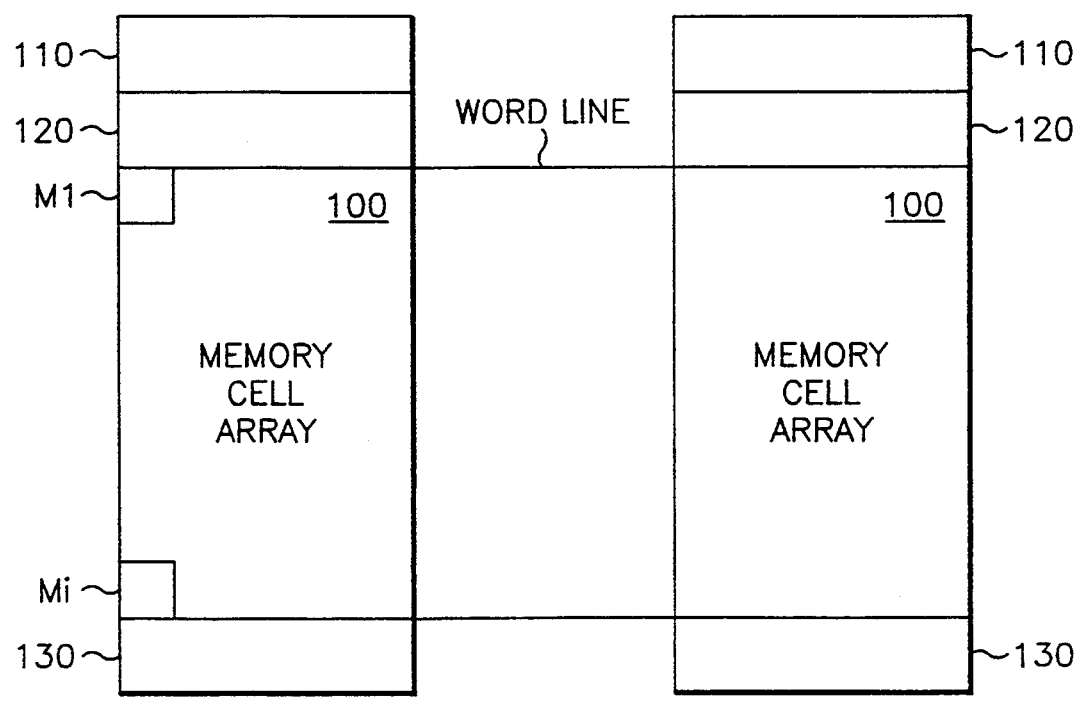
FIG. 2 shows a memory cell array layout of a semiconductor memory device and including the precharge circuit of FIG. 1.

When one of the two memory cells M1 and Mi sharing a bit line and separated farthest from each other is selected during a write recovery operation, a time delay difference of bit line precharge between memory cell M1 and Mi is minimized compared to the same time delay difference in the conventional circuit of FIG. 1. Thus, it can be said that the write recovery characteristics of associated memory cells are significantly improved (i.e., higher speed of operation is possible) as the time delay difference of the bit line precharge is reduced.

It should be readily clear that the precharge circuit arrangement of the present invention results in no substantial difference of write recovery (read—immediately after write) timing among memory cells along a bit line.

In addition, current difference per unit time flowing through the two spatially remotest memory cells M1 and Mi is minimized because the first set of bit line precharge transistors P11 and P12 and the second set of bit line precharge transistors P13 and P14 are separated by a roughly fixed and opposite distance with respect to a center reference along a bit line pair. Thus, current sensing necessary for memory cell read operations becomes significantly faster.

The bit line precharge circuits 110, 120 thus more rapidly precharge a selected memory cell along any one of the uniquely charge-distributed bit lines because the precharge circuits are not centralized as in conventional memory devices.

Memory cells along an upper half of memory cell array 100 can be said to be under the control of precharge circuit 110 at least for purposes of determining minimum speed of a precharge/read operation immediately following a write operation.

Figure 5:
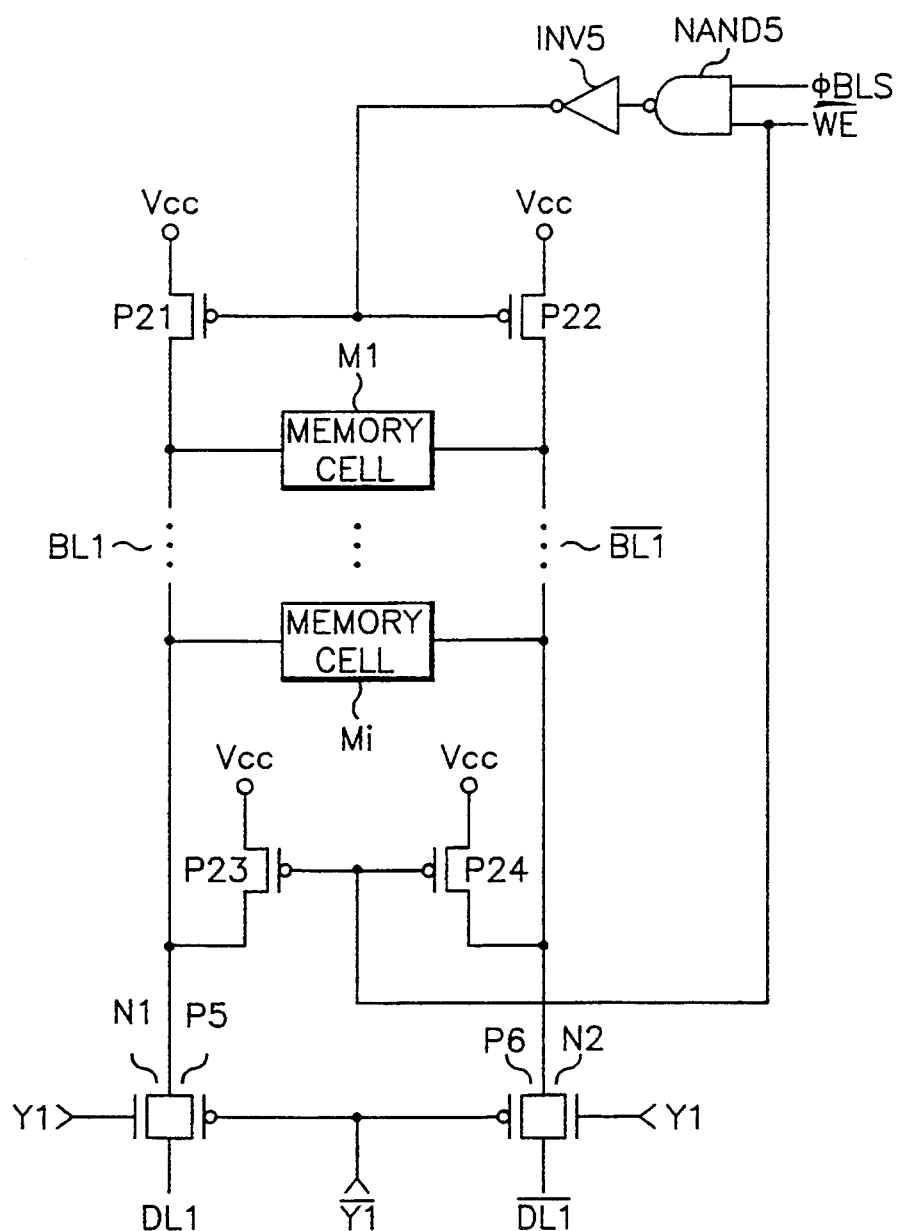
FIG. 5 shows a second embodiment of a portion of the memory device in FIG. 3.

FIG. 5 is a variation of the first embodiment also corresponding to the block construction of FIG. 3. A first set of bit line precharge transistors P21 and P22, enabled under the control of write enable signal WE and block selection signal ΦBLS, are arranged on one end of a bit line pair BL1 and BL1. A second set of bit line precharge transistors P23 and P24, enabled under the control of bit line precharge signal ΦPRE, are arranged on the other end of the bit line pair BL1 and BL1 closest in distance to the column decoder associated therewith.

When one of the memory cells M1 to Mi sharing a bit line pair is selected during a write operation, second bit line precharge circuits P23, P24 are disabled and first bit line precharge transistors P21, P22 are turned on in response to a logic "low" write enable WE indicative of a write operation.

When not in write mode, first bit line precharge circuit P21, P22 and second bit line precharge circuit P23, P24 are both simultaneously enabled to continuously precharge bit line pair BL1 and BL1.

The PMOS transistors employed in the bit line precharge circuits of the present invention may be replaced by NMOS or CMOS transistors without departing from the general scope of the present invention as set forth in applicants' claims.

Although a memory device having two bit line precharge transistors per bit line is described in connection with the present invention, it is noted that the present invention may also be applied to a memory device having more than two bit line precharge transistors per bit line.

As described above, bit line pair precharge time is sufficiently minimized by the unique configuration presented in the inventive circuit described above and illustrated in FIGS. 4 and 5. As a result, degradation of write recovery memory cell operations caused by an increase of bit line parasitic capacitances and parasitic resistances along a bit line pair memory device arrangement of great complexity (i.e., LSI, VLSI and ULSI technologies) is significantly reduced.

Furthermore, as any one memory cell along a long bit line pair is selected, a bit line current per unit of time is substantially similar to that of any other memory cell selected along a different spatial position on the same bit line pair.

The invention is in no way intended to be limited by the embodiments described hereinabove. Various modifications of the disclosed embodiments as well as other embodiments of the invention will become apparent to persons skilled in the art upon reference to the description of the invention. It is therefore contemplated that the appended claims will cover any such modifications or embodiments as fall within the true scope of the invention.

What is claimed is:

1. A semiconductor memory device having a number of memory cells each sharing a pair of bit lines, each bit line pair together with corresponding memory cells forming a memory cell array, said semiconductor memory device comprising:

first bit line precharge means coupled to a first position along a bit line pair for precharging the bit lines of said bit line pair under the control of a block selection signal and a write enable signal; and second bit line precharge means coupled at a second position along said bit line pair for precharging said bit lines of said bit line pair under the control of the write enable signal, said first and second positions substantially corresponding to respective opposite ends of said bit line pair to reduce a precharge time and a write recovery time associated with said bit line pair.

2. The semiconductor memory device of claim 1, wherein said second bit line precharge means is normally turned on to continuously precharge said bit line pair.

3. A semiconductor memory device having a number of memory cells each sharing a pair of bit lines, each bit line pair together with corresponding memory cells forming a memory cell array, said semiconductor memory device comprising:

first bit line precharge means coupled to a first position along a bit line pair for precharging the bit lines of said bit line pair; and second bit line precharge means coupled at a second position along said bit line pair for also precharging said bit lines of said bit line pair, said first and second positions substantially corresponding to respective opposite ends of said bit line pair to reduce a precharge time associated with said bit line pair and defining a positional distance within which there is also included all memory cells associated with said bit line pair.

4. A semiconductor memory device having a number of memory cells each sharing a pair of bit lines, each bit line pair together with corresponding memory cells forming a memory cell array, said semiconductor memory device comprising:

first bit line precharge means coupled to a first position along a bit line pair for precharging the bit lines of said bit line pair; and second bit line precharge means coupled at a second position along said bit line pair for also precharging said bit lines of said bit line pair, said first and second positions substantially corresponding to respective opposite ends of said bit line pair to reduce a precharge time associated with said bit line pair so that the precharge time is substantially identical with respect to any selected memory cell associated with said bit line pair.

* * * * *